United States Patent
Huang et al.

(10) Patent No.: US 9,627,559 B2
(45) Date of Patent: Apr. 18, 2017

(54) OPTICAL ASSEMBLIES INCLUDING DRY ADHESIVE LAYERS AND ASSOCIATED METHODS

(71) Applicant: OmniVision Technologies, Inc., Santa Clara, CA (US)

(72) Inventors: Chun-Shan Huang, Santa Clara, CA (US); Chia-Yang Chang, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 114 days.

(21) Appl. No.: 14/659,596

(22) Filed: Mar. 16, 2015

(65) Prior Publication Data
US 2016/0276502 A1    Sep. 22, 2016

(51) Int. Cl.
*H01L 31/18* (2006.01)
*H01L 31/0232* (2014.01)
*H01L 27/146* (2006.01)

(52) U.S. Cl.
CPC .. *H01L 31/02325* (2013.01); *H01L 27/14625* (2013.01); *H01L 31/18* (2013.01); *Y02P 70/521* (2015.11)

(58) Field of Classification Search
CPC .. H01L 31/02325; H01L 31/18; H01L 27/146
See application file for complete search history.

(56) References Cited

U.S. PATENT DOCUMENTS

| | | |
|---|---|---|
| 8,822,258 B2 | 9/2014 | Fan |
| 2007/0252227 A1* | 11/2007 | Fukuda ............ H01L 27/14618 257/432 |
| 2011/0273600 A1 | 11/2011 | Kriman et al. |
| 2013/0242182 A1 | 9/2013 | Rudmann et al. |
| 2014/0110807 A1 | 4/2014 | Uekawa |
| 2014/0125849 A1 | 5/2014 | Heimgartner et al. |

* cited by examiner

*Primary Examiner* — Tony Ko
(74) *Attorney, Agent, or Firm* — Lathrop & Gage LLP

(57) ABSTRACT

An optical assembly includes an image sensor, a lens module disposed over the image sensor in a first direction, a transparent glue layer, and a transparent dry adhesive layer formed of a different material than the transparent glue layer. Each of the transparent glue layer and the transparent dry adhesive layer are disposed between the image sensor and the lens module in the first direction. Each of the transparent glue layer and the transparent dry adhesive layer are optically coupled in series with the image sensor and the lens module. A method for forming an optical assembly includes joining an image sensor and a lens module using a transparent glue layer and a transparent dry adhesive layer formed of a different material than the transparent glue layer.

12 Claims, 5 Drawing Sheets

OPTICAL ASSEMBLIES INCLUDING DRY ADHESIVE LAYERS AND ASSOCIATED METHODS

BACKGROUND

Wafer-level techniques may be used to produce multiple optical elements in parallel. Wafer-level techniques typically include forming a wafer including an array of optical elements, such as an array of lenses or an array of image sensors. The wafer is singulated, or in other words, divided into a number of pieces, to separate the optical elements of the array. Alternately, two more or wafers of optical elements are joined together to form a bonded wafer assembly, and the bonded wafer assembly is subsequently singulated to yield a plurality of optical assemblies, where each optical assembly typically includes an optical element from each wafer.

Optical elements of a given array are typically designed to be identical. For example, lenses of an array of lenses on a wafer will typically be designed to have identical properties. However, there are usually variations among optical elements in an array due to manufacturing imperfections. Such variations may require that some optical element instances be rejected, thereby negatively impacting manufacturing yield.

For example, FIG. 1 cross-sectionally illustrates several lens modules 100 of an array (not shown) of lens modules formed using wafer-level techniques. In this document, a specific instance of an item may be referred to by use of a numeral in parentheses (e.g., lens module 100(1)) while numerals without parentheses refer to any such item (e.g., lens modules 100). Lens modules 100 are designed to have a flange focal length (FFL) 102 of nominal value 104, where FFL 102 of a given lens module 100 is a distance from a reference plane 106 of the lens module to a focal point 108 of the lens module. FFL 102, however, will often vary at least somewhat from nominal value 104, as illustrated in FIG. 1, due to manufacturing imperfections. For example, lens module 100(1) has a FFL 102(1) that is shorter than nominal value 104, lens module 100(2) has a FFL 102(2) that is longer than nominal value 104, and lens module 100(3) has a FFL 102(3) that is equal to nominal value 104.

FIG. 2 cross-sectionally illustrates three optical assemblies 200 formed by joining lens modules 100 of FIG. 1 with respective image sensors 202 using transparent glue 204. Optical assemblies 200 are designed to generate an in-focus image when lens modules 100 have FFLs 102 equal to nominal value 104. Specifically, when FFL 102 of a given lens module 200 is equal to nominal value 104, the focal point 108 of the lens module will be aligned with an image plane 206 of its respective image sensor 102. Accordingly, optical assembly 200(3) will generate an in-focus image because its FFL 102(3) is equal to nominal value 104. Optical assemblies 200(1) and 200(2), in contrast, will not generate in-focus images because their respective FFLs 102(1) and 102(2) are significantly different from nominal value 104. Consequentially, optical assemblies 200(1) and 200(2) may not meet performance objectives and may therefore need to be rejected.

SUMMARY

In an embodiment, an optical assembly includes an image sensor, a lens module disposed over the image sensor in a first direction, a transparent glue layer, and a transparent dry adhesive layer formed of a different material than the transparent glue layer. Each of the transparent glue layer and the transparent dry adhesive layer are disposed between the image sensor and the lens module in the first direction. Each of the transparent glue layer and the transparent dry adhesive layer are optically coupled in series with the image sensor and the lens module.

In an embodiment, a method for forming an optical assembly includes joining an image sensor and a lens module in a first direction using a transparent glue layer and a transparent dry adhesive layer formed of a different material than the transparent glue layer. Each of the transparent glue layer and the transparent dry adhesive layer is optically coupled in series with the image sensor and the lens module.

DETAILED DESCRIPTION OF THE EMBODIMENTS

Applicant has discovered that a discrepancy between a lens module's intended FFL and its actual FFL can be at least partially compensated for by including one or more transparent dry adhesive layers between the lens module and an image sensor joined thereto. A thickness of the transparent dry adhesive layer is a function of the lens module's FFL. In particular, a thickness of the transparent dry adhesive layer is chosen such that a focal point of the lens module is substantially aligned with the image plane of the image sensor, when the lens module is joined to the image sensor. For example, a transparent dry adhesive layer used with a lens module having a long FFL will have a relatively large thickness, to compensate for the long FFL of the lens module. On the other hand, a transparent dry adhesive layer used with a lens module having a short FFL will have a relatively small thickness, to compensate for the short FFL of the lens module. Such tuning of transparent dry adhesive layer thickness according to lens module FFL may minimize, or even essentially eliminate, performance degradation associated with discrepancy between actual FFL and its intended value, thereby promoting high manufacturing yield.

Additionally, it relatively simple to achieve thick layers of transparent dry adhesive. For example, a transparent dry adhesive layer of significant thickness can typically be formed in a single manufacturing step. Therefore, use of transparent dry adhesive layers to compensate for FFL variations promotes manufacturing efficiency and low manufacturing cost. In contrast, multiple manufacturing steps are typically required to form thick layers of some other adhesive materials, such as transparent glue.

Figure 1:
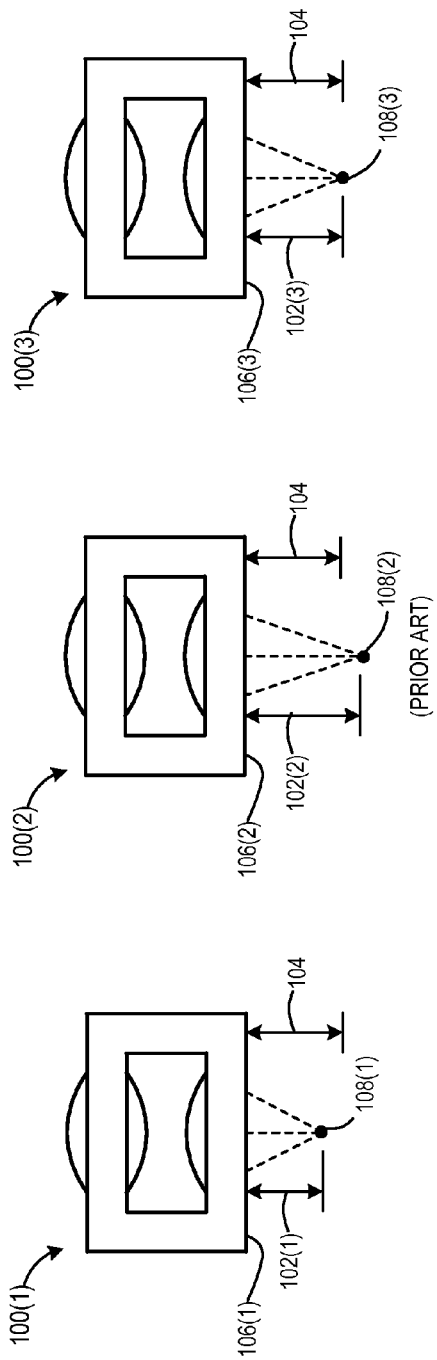
FIG. 1 is a cross-sectional view of three lens modules formed using wafer-level techniques.
Figure 2:
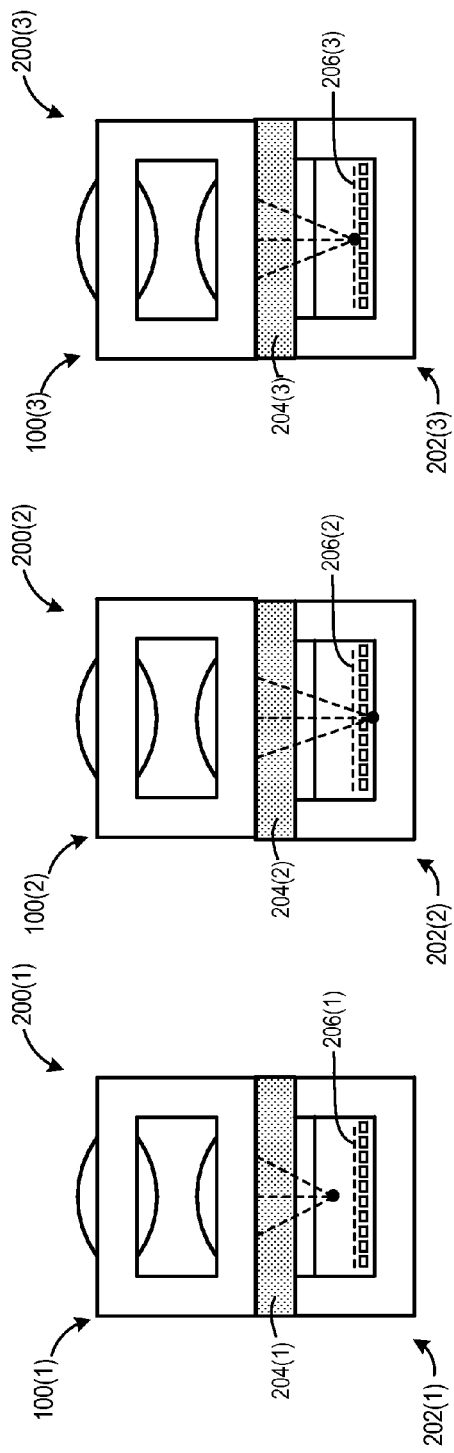
FIG. 2 is a cross-sectional view of three optical assemblies including the lens modules of FIG. 1.
Figure 3:
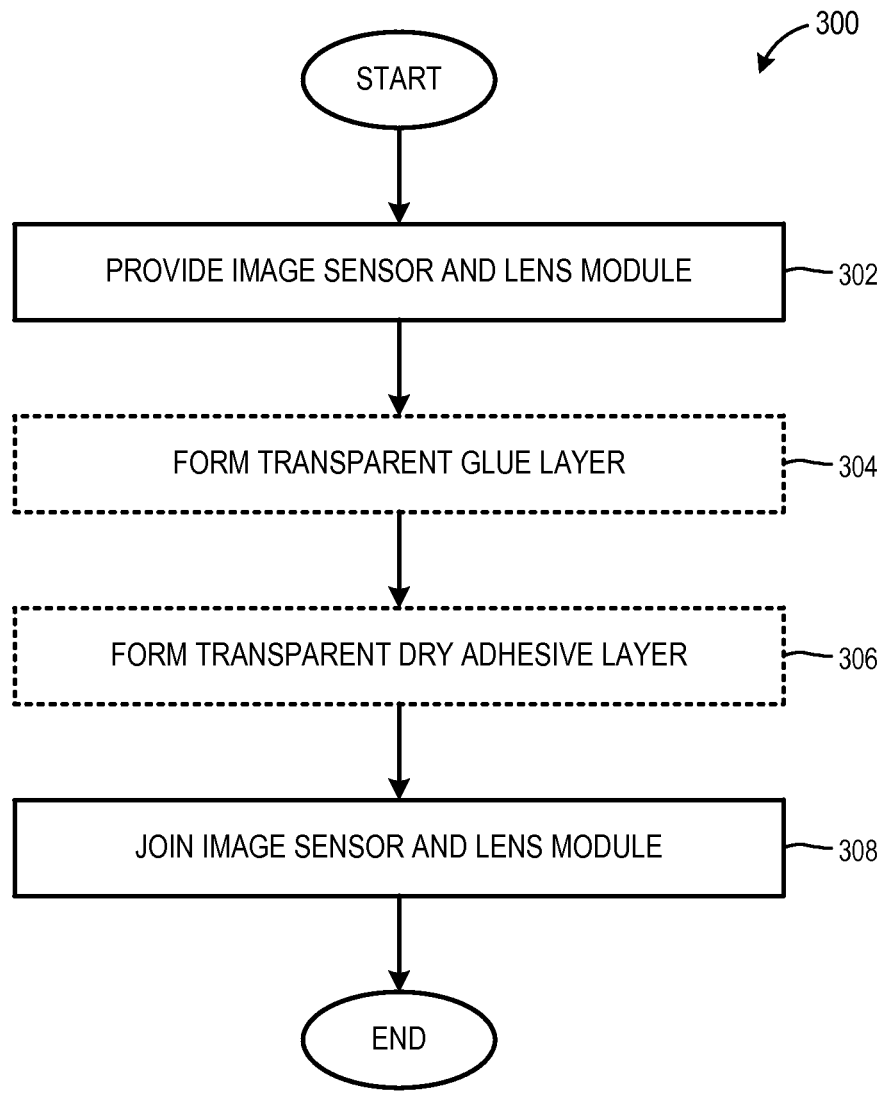
FIG. 3 illustrates a method for forming an optical assembly including a dry adhesive layer, according to an embodiment.
Figure 4:
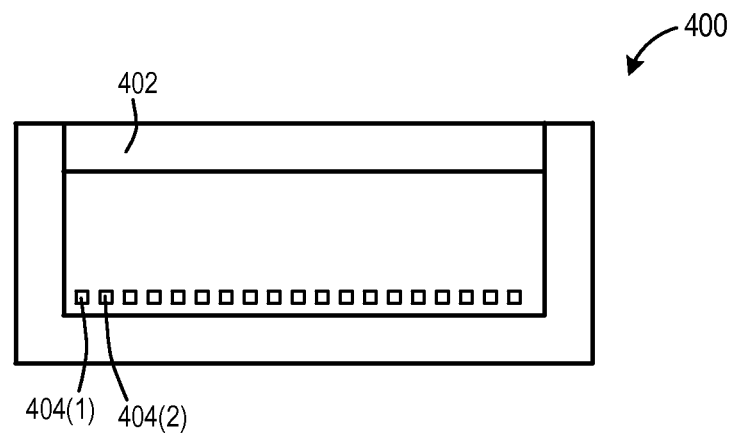
FIG. 4 is a cross-sectional view of an image sensor.

FIG. 3 illustrates a method 300 for forming an optical assembly including a transparent dry adhesive layer. FIGS. 4-7 illustrate one example of method 300. FIGS. 3-7 are best view together in the following discussion.

Figure 5:
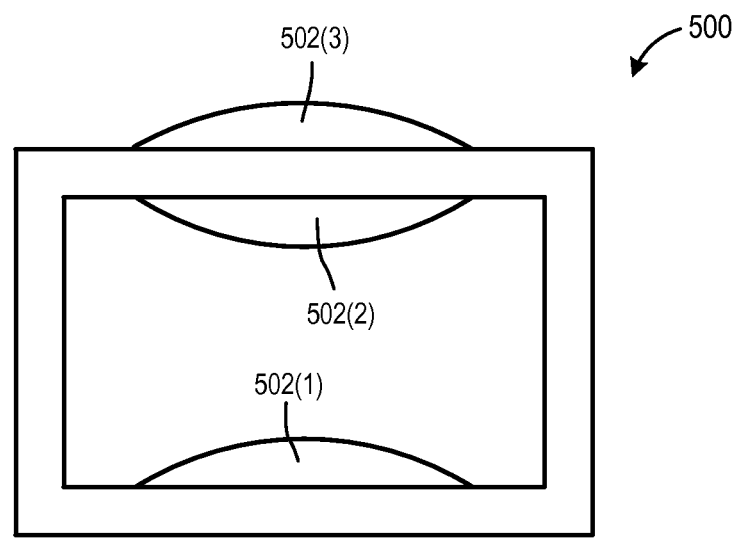
FIG. 5 is a cross-sectional view of a lens module.
Figure 6:
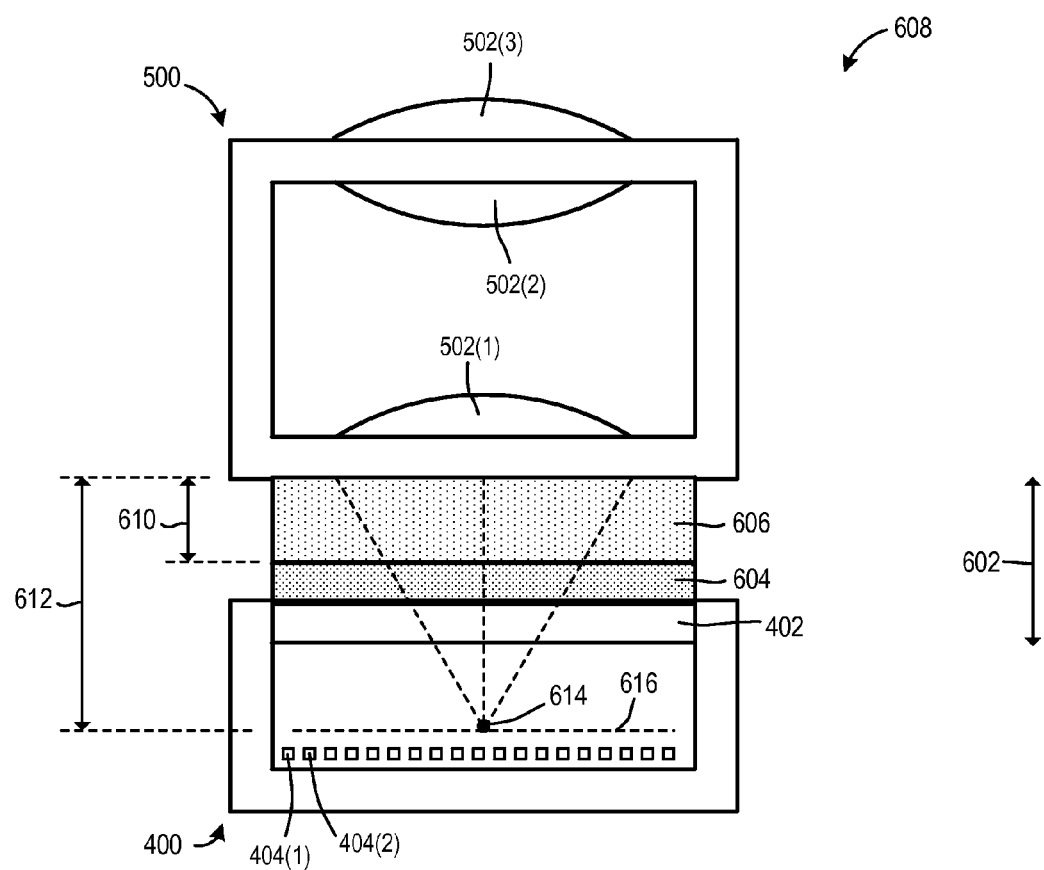
FIG. 6 is a cross-sectional view of an optical assembly including a dry adhesive layer, according to an embodiment.

Method 300 begins with a step 302 of providing an image sensor and a lens module. In one example of step 302, an image sensor 400, shown in cross-sectional view in FIG. 4, and a lens module 500, shown in cross-sectional view in FIG. 5, are provided. Image sensor 400 is, for example, a complementary-metal-oxide-semiconductor (CMOS) image sensor or a charge coupled device (CCD) image sensor. Image sensor 400 includes a glass outer surface 402 and a plurality of photosensitive elements 404 below glass outer surface 402. Each photosensitive element 404 generates a respective electrical signal in response to light incident thereon. Only several photosensitive elements 404 are labeled in FIG. 4 to promote illustrative clarity. Although not required, image sensor 400 will typically further include a color filter array (not shown), such as a color filter array having a Bayer pattern. Lens module 500 includes one or more lenses 502.

In step 308, the image sensor is joined with the lens module in a first direction, using a transparent glue layer and a transparent dry adhesive layer, each optically coupled in series with the image sensor and the lens module, to yield an optical assembly. The transparent dry adhesive layer is formed of a different material than the transparent glue layer and has a thickness that is a function of the FFL of the lens module, as discussed below. In one example of step 308, image sensor 400 is joined with lens module 500 in a first direction 602, using a transparent glue layer 604 and a transparent dry adhesive layer 606 optically coupled in series with image sensor 400, glass outer surface 402, photosensitive elements 404, and lens module 500, to yield an optical assembly 608, as cross-sectionally illustrated in FIG. 6. Lens module 500 and lenses 502 are therefore disposed over each of transparent dry adhesive layer 606, transparent glue layer 604, and image sensor 400, in first direction 602. In some embodiments, transparent glue layer 604 includes an epoxy material and transparent dry adhesive layer 606 includes an acrylic material. However, transparent glue layer 604 and/or transparent dry adhesive layer 606 could be formed of alternative adhesive materials as long as the adhesive materials are at least partially transparent to light of wavelengths of interest.

Method 300 optionally further includes steps 304 and 306. In step 304, a transparent glue layer is formed, and in step 306, a transparent dry adhesive layer is formed. Although FIG. 3 illustrates step 304 being performed before step 306, step 306 could alternately be performed before, or in parallel with, step 304. In one example of steps 304 and 306, transparent glue layer 604 is disposed on glass outer surface 402, and transparent dry adhesive layer 606 is disposed on transparent glue layer 604. In another example of steps 304 and 306, transparent dry adhesive layer 606 is disposed on glass outer surface 402, and transparent glue layer 604 is disposed on transparent dry adhesive layer 606. In another example of steps 304 and 306, transparent glue layer 604 is disposed on lens module 500, and transparent dry adhesive layer 606 is disposed on transparent glue layer 604. In yet another example of steps 304 and 306, transparent dry adhesive layer 606 is disposed on lens module 500, and transparent glue layer 604 is disposed on transparent dry adhesive layer 606.

Thickness of the transparent dry adhesive layer used in method 300 is chosen so that a focal point of the lens module is aligned with the image plane of the image sensor, when the lens module is joined with image sensor. Accordingly, thickness of the transparent dry adhesive layer is a function of the FFL of the lens module, and thickness of the transparent dry adhesive layer may differ from that of the transparent glue layer. For example, a thickness 610 of transparent dry adhesive layer 606 in first direction 602 is chosen in accordance with a FFL 612 of lens module 500 so that a focal point 614 of lens module 500 is aligned in first direction 602 with an image plane 616 of image sensor 400. Some embodiments of method 300 further include the step of the determining the FFL of the lens module.

Figure 7:
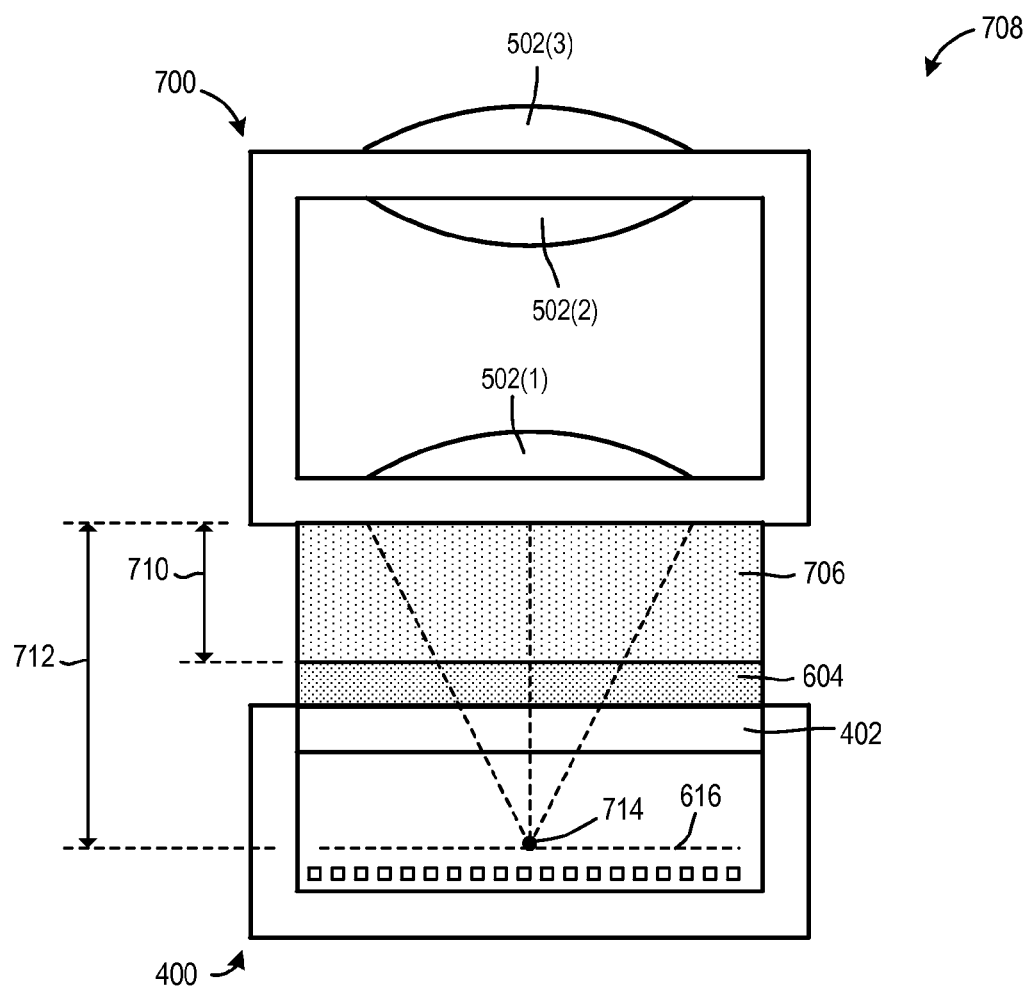
FIG. 7 is a cross-sectional view of another optical assembly including a dry adhesive layer, according to an embodiment.

As another example, consider optical assembly 708 which is cross-sectionally illustrated in the FIG. 7. Optical assembly 708 is also formed by method 300, and optical assembly 708 is similar to optical assembly 608 of FIG. 6. However, optical assembly 708 includes a lens module 700 in place of lens module 500 and a transparent dry adhesive layer 706 in place of transparent dry adhesive layer 606. A FFL 712 of lens module 700 is larger than FFL 612 of lens module 600. Consequentially, a thickness 710 of transparent dry adhesive layer 706 is greater than thickness 610 of transparent dry adhesive layer 606, so that focal point 714 of lens module 700 is aligned with image plane 616 of image sensor 400.

Although method 300 is discussed with respect to forming a single optical assembly, multiple instances of method 300 could be executed in parallel to form multiple optical assemblies, such as using wafer-level techniques. In such case, the lens modules may be designed to have a sufficiently long nominal FFL so that even if the FFL is at its minimum expected value, in-focus imaging can be achieved with an appropriate dry adhesive layer thickness.

Combinations of Features

Features described above as well as those claimed below may be combined in various ways without departing from the scope hereof. The following examples illustrate some possible combinations:

(A1) An optical assembly may include an image sensor, a lens module disposed over the image sensor in a first direction, a transparent glue layer, and a transparent dry adhesive layer formed of a different material than the transparent glue layer. Each of the transparent glue layer and the transparent dry adhesive layer may be disposed between the image sensor and the lens module in the first direction. The transparent glue layer and the transparent dry adhesive layer each may be optically coupled in series with the image sensor and the lens module.

(A2) In the optical assembly denoted as (A1), the image sensor may include a glass outer surface, with the transparent glue layer and the transparent dry adhesive layer being optically coupled in series with the glass outer surface.

(A3) In the optical assembly denoted as (A2), the image sensor may include a plurality of photosensitive elements below the glass outer surface.

(A4) In any of the optical assemblies denoted as (A1) through (A3), the lens module may include at least one lens disposed over both of the transparent glue layer and the transparent dry adhesive layer, in the first direction.

(A5) In any of the optical assemblies denoted as (A1) through (A4), the transparent glue layer may include an epoxy material and the transparent dry adhesive layer may include an acrylic material.

(A6) In any of the optical assemblies denoted as (A1) through (A5), a thickness of the transparent glue layer in the first direction may be different from a thickness of the transparent dry adhesive layer in the first direction.

(B1) A method for forming an optical assembly may include joining an image sensor and a lens module in a first direction using a transparent glue layer and a transparent dry adhesive layer formed of a different material than the transparent glue layer, where each of the transparent glue layer and the transparent dry adhesive layer is optically coupled in series with the image sensor and the lens module.

(B2) The method denoted as (B1) may further include, before the step of joining, disposing the transparent glue layer over one of the image sensor and the lens module.

(B3) The method denoted as (B1) may further include, before the step of joining, disposing the transparent dry adhesive layer over one of the image sensor and the lens module.

(B4) The method denoted as (B1) may further include, before the step of joining, disposing the transparent dry adhesive layer over the transparent glue layer.

(B5) The method denoted as (B1) may further include, before the step of joining, disposing the transparent glue layer over the transparent dry adhesive layer.

(B6) Any of the methods denoted as (B1) through (B5) may further include forming the transparent dry adhesive layer to have a thickness that is a function of a flange focal length of the lens module.

(B7) The method denoted as (B6) may further include determining the flange focal length of the lens module, before the step of forming the transparent dry adhesive layer.

(B8) In any of the methods denoted as (B1) through (B7), the transparent glue layer may include an epoxy material, and the transparent dry adhesive layer may include an acrylic material.

Changes may be made in the above devices, methods, and systems without departing from the scope hereof. For example, the transparent glue layer could be omitted so that transparent dry adhesive layer contacts both the image sensor and lens module. As another example, two or more transparent dry adhesive layers may be disposed between the image sensor and the lens module. Therefore, the matter contained in the above description and shown in the accompanying drawings should be interpreted as illustrative and not in a limiting sense. The following claims are intended to cover generic and specific features described herein, as well as statements of the scope of the present devices, methods, and systems, which as a matter of language, might be said to fall therebetween.

What is claimed is:

1. An optical assembly, comprising:
   an image sensor including a glass outer surface;
   a lens module disposed over the image sensor in a first direction;
   a transparent glue layer disposed between the image sensor and the lens module in the first direction; and
   a transparent dry adhesive layer, formed of a different material than the transparent glue layer, disposed between the image sensor and the lens module in the first direction,
   the transparent glue layer and the transparent dry adhesive layer each being optically coupled in series with the glass outer surface and the lens module.

2. The optical assembly of claim 1, the image sensor comprising a plurality of photosensitive elements below the glass outer surface.

3. The optical assembly of claim 2, the lens module comprising at least one lens disposed over both of the transparent glue layer and the transparent dry adhesive layer, in the first direction.

4. The optical assembly of claim 2, the transparent glue layer comprising an epoxy material and the transparent dry adhesive layer comprising an acrylic material.

5. The optical assembly of claim 2, a thickness of the transparent glue layer in the first direction being different from a thickness of the transparent dry adhesive layer in the first direction.

6. A method for forming an optical assembly, comprising:
   joining an image sensor and a lens module in a first direction using a transparent glue layer and a transparent dry adhesive layer formed of a different material than the transparent glue layer, each of the transparent glue layer and the transparent dry adhesive layer being optically coupled in series with the image sensor and the lens module; and
   prior to the step of joining, forming the transparent dry adhesive layer to have a thickness that is a function of a flange focal length of the lens module.

7. The method of claim 6, further comprising, before the step of joining, disposing the transparent glue layer over one of the image sensor and the lens module.

8. The method of claim 6, further comprising, before the step of joining, disposing the transparent dry adhesive layer over one of the image sensor and the lens module.

9. The method of claim 6, further comprising, before the step of joining, disposing the transparent dry adhesive layer over the transparent glue layer.

10. The method of claim 6, further comprising, before the step of joining, disposing the transparent glue layer over the transparent dry adhesive layer.

11. The method of claim 6, further comprising determining the flange focal length of the lens module, before the step of forming the transparent dry adhesive layer.

12. The method of claim 6, the transparent glue layer comprising an epoxy material, and the transparent dry adhesive layer comprising an acrylic material.

\* \* \* \* \*